(12) United States Patent
Miller

(10) Patent No.: US 8,236,108 B1
(45) Date of Patent: Aug. 7, 2012

(54) INERTIAL MASKING ASSEMBLY

(75) Inventor: Casey W. Miller, Tampa, FL (US)

(73) Assignee: University of South Florida, Tampa, FL (US)

( * ) Notice: Subject to any disclaimer, the term of this patent is extended or adjusted under 35 U.S.C. 154(b) by 685 days.

(21) Appl. No.: 12/430,327

(22) Filed: Apr. 27, 2009

Related U.S. Application Data

(60) Provisional application No. 61/047,781, filed on Apr. 25, 2008.

(51) Int. Cl.
*C23C 16/00* (2006.01)

(52) U.S. Cl. ........ 118/721; 118/213; 118/301; 118/406; 118/504

(58) Field of Classification Search .................. 118/721, 118/213, 301, 406, 504
See application file for complete search history.

(56) References Cited

U.S. PATENT DOCUMENTS

| | | | |
|---|---|---|---|
| 3,312,190 A | 4/1967 | Bradshaw | |
| 4,527,186 A * | 7/1985 | Acker | 396/429 |
| 6,214,631 B1 | 4/2001 | Burrows et al. | |
| 6,547,939 B2 | 4/2003 | Hsueh et al. | |
| 6,649,208 B2 | 11/2003 | Rodgers | |
| 7,115,168 B2 | 10/2006 | Grantham et al. | |
| 7,229,669 B2 | 6/2007 | Younger et al. | |
| 2006/0057289 A1 * | 3/2006 | Simpson et al. | 427/256 |
| 2008/0017110 A1 | 1/2008 | Kim | |

FOREIGN PATENT DOCUMENTS

JP 07151910 * 6/1995

OTHER PUBLICATIONS

Cooper, J.S., Zhang, G., and McGinn, P.J. 2005. "Plasma sputtering system for deposition of thin film combinatorial libraries." Review of Scientific Instruments. vol. 76. pp. 062221-1-06221-7.

* cited by examiner

*Primary Examiner* — Keath Chen
(74) *Attorney, Agent, or Firm* — Nilay J. Choksi; Courtney M. Dunn; Smith & Hopen, P.A.

(57) ABSTRACT

An inertial masking assembly that allows multiple thin film structures to be deposited on a single substrate by rotation of a shadow mask relative to the substrate. The assembly rotates the position of the shadow mask by the conservation of momentum. The substrate is seated on means for rotating the substrate in a confined orbit within the mask. Abruptly changing the angular velocity of the mask causes the mask to rotate under the substrate, which is mediated by a combination of friction and the substrate's inertia.

19 Claims, 12 Drawing Sheets

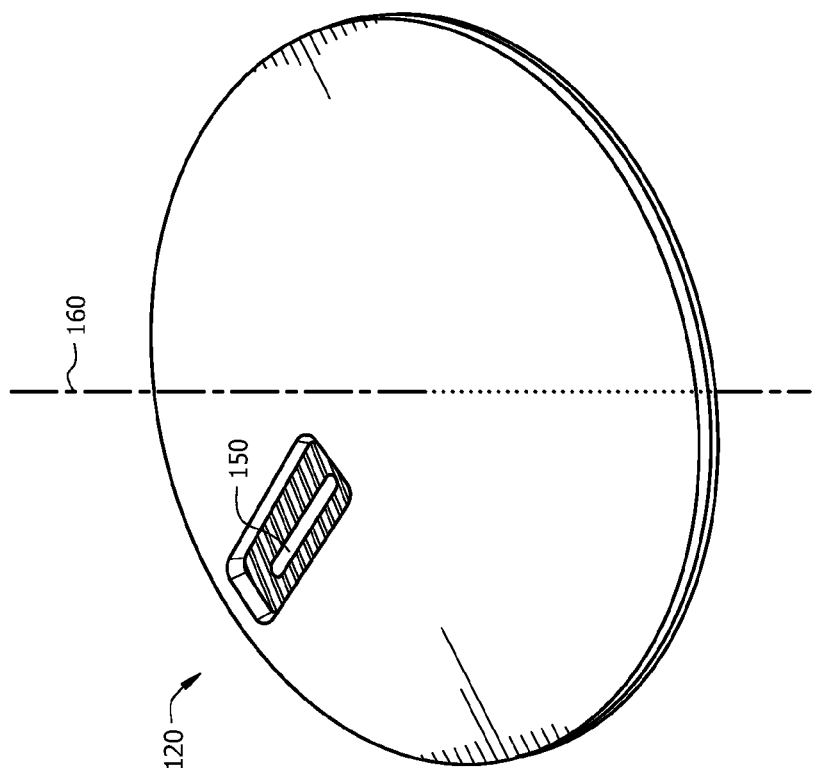
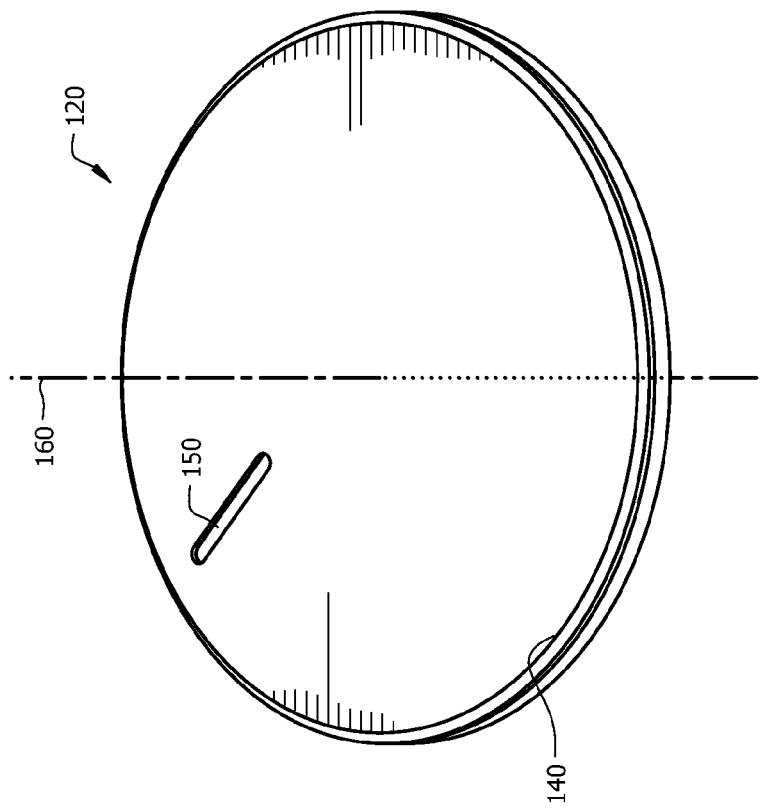

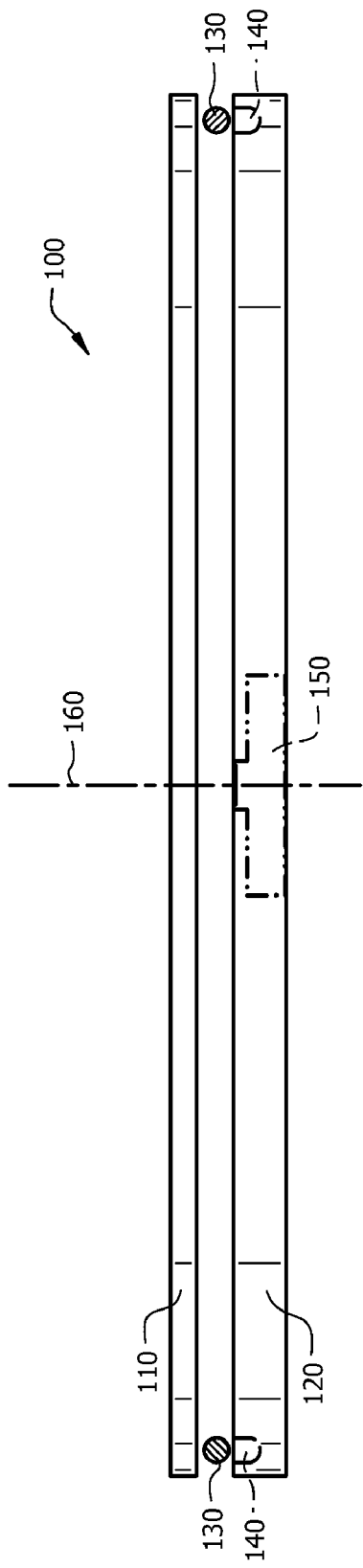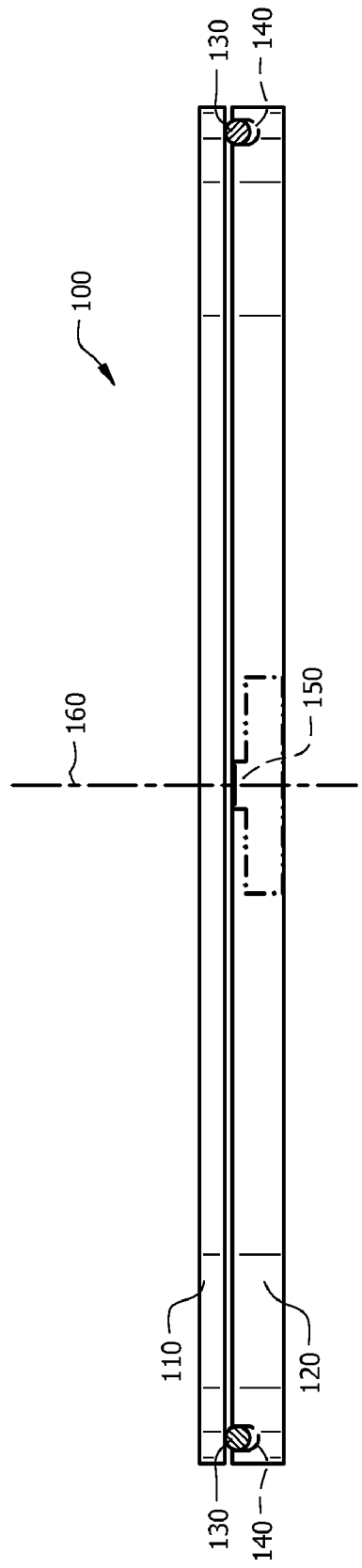

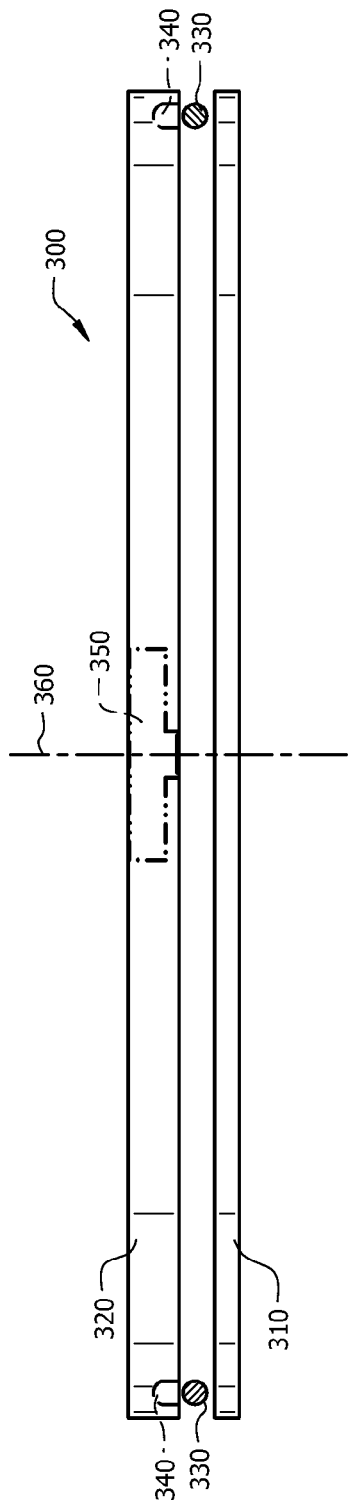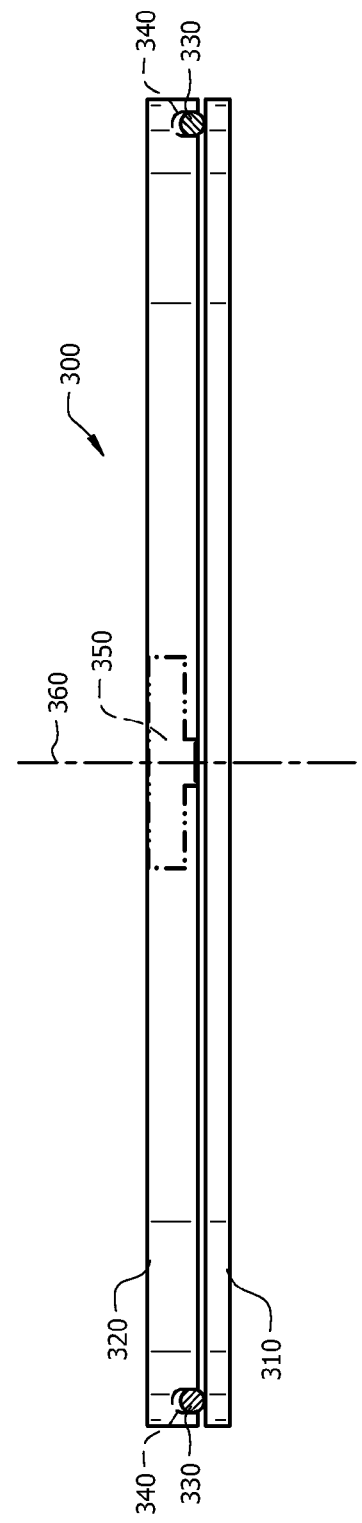

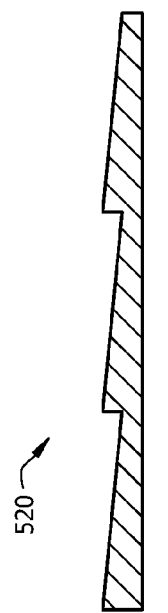# 
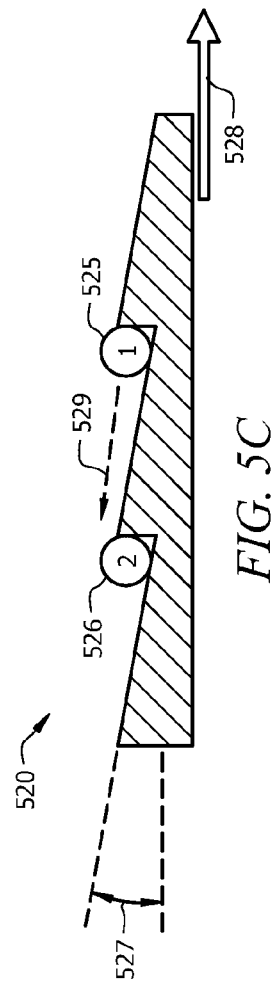
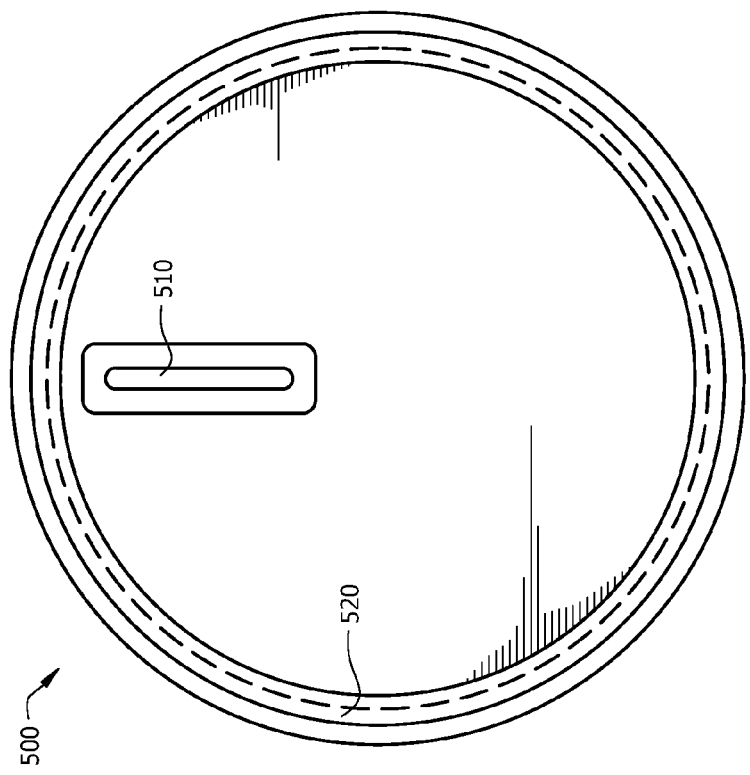

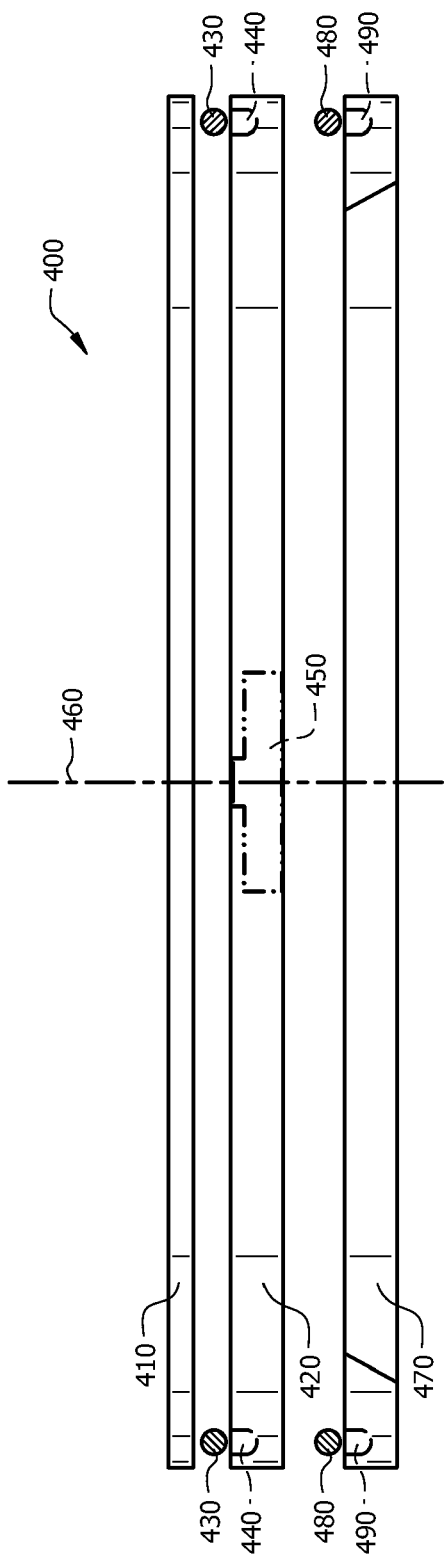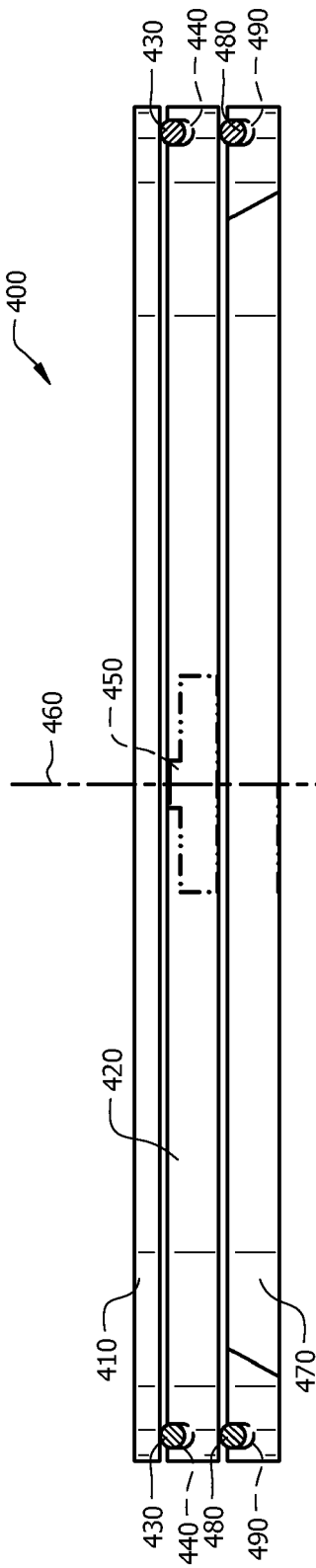

INERTIAL MASKING ASSEMBLY

CROSS REFERENCE TO RELATED APPLICATIONS

This application claims priority to U.S. Provisional Patent Application No. 61/047,781, filed Apr. 25, 2008.

FIELD OF INVENTION

This invention relates to thin film deposition. Specifically, this invention allows a shadow mask to be rotated relative to a substrate in order to allow several samples to be grown on a single substrate.

SUMMARY OF INVENTION

The present invention includes an inertial masking assembly that rotates the position of a shadow mask relative to a substrate by conservation of momentum. The substrate is seated on ball bearings confined to an orbit within the mask. Abruptly changing the angular velocity of the mask causes the mask to rotate under the substrate, which is mediated by a combination of friction and the substrate's inertia.

In a first embodiment, the inertial masking assembly comprises a mask, and a means for rotating a substrate above and substantially parallel to the mask. The mask has a bearing channel formed on its substrate-facing side. The means for rotating a substrate above and substantially parallel to the mask are positioned in the bearing channel of the mask. The inertial masking assembly may further comprise a substrate. The substrate is seated on the means for rotating a substrate above and substantially parallel to the mask and positioned such that it is above and parallel to the mask. The means for rotating a substrate above and substantially parallel to the mask separate the mask and substrate such that there is no direct contact between the mask and the substrate. In an embodiment, an abrupt change in the angular velocity of the mask causes the mask to rotate relative to the substrate; whereas a gradual change in the angular velocity of the mask causes both the mask and the substrate to rotate. In another embodiment, an abrupt change in the angular velocity of the substrate causes the substrate to rotate relative to the mask; whereas a gradual change in the angular velocity of the substrate causes both the mask and the substrate to rotate. The channel formed in the mask may be located along the perimeter of the mask. The cross-section of the channel formed in the mask may have a sawtooth shape.

The assembly may further comprise a mask seat and a means for rotating the mask above and substantially parallel to the mask seat. In this embodiment, there is at least one recess located in the evaporant-facing side of the mask. The mask seat is positioned below and parallel to the mask. The mask seat also has a channel formed in the mask-facing side and at least one post on the same side. The means for rotating the mask above and substantially parallel to the mask seat are positioned in the channel of the mask seat and the mask is seated on the means such that the mask and mask seat are substantially parallel to each other and the means are in contact with the evaporant-facing side of the mask. The mask seat and mask are further positioned such that the post of the mask seat is positioned at least partially within the recess of the mask. Rotation of the mask seat causes the post to contact the interior of the recess, such contact causing an impulse to be delivered to the mask, and such impulse causing rotation of the mask.

Alternatively, the assembly may further comprise a mask seat and means for rotating the mask above and substantially parallel to the mask seat. In this embodiment, the mask seat is positioned below and parallel to the mask. The mask seat also has a channel formed in the mask-facing side. The means for rotating the mask above and substantially parallel to the mask seat are positioned in the channel of the mask seat and the mask is seated on the means such that the mask and mask seat are parallel to each other and the means are in contact with the evaporant-facing side of the mask. The position of the mask seat may be fixed.

In another embodiment, the inertial masking assembly comprises a mask and a means for rotating the mask above and substantially parallel to a substrate. The mask has a bearing channel formed on its substrate-facing side. The means for rotating the mask above and substantially parallel to a substrate are positioned in the bearing channel of the mask. The inertial masking assembly may further comprise a substrate. The substrate is in contact with the means for rotating the mask above and substantially parallel to a substrate and positioned such that it is below and substantially parallel to the mask. The means separate the mask and substrate such that there is no direct contact between the mask and the substrate. In an embodiment, an abrupt change in the angular velocity of the mask causes the mask to rotate relative to the substrate; whereas a gradual change in the angular velocity of the mask causes both the mask and the substrate to rotate. In another embodiment, an abrupt change in the angular velocity of the substrate causes the substrate to rotate relative to the mask; whereas a gradual change in the angular velocity of the substrate causes both the mask and the substrate to rotate. The channel formed in the mask may be located along the perimeter of the mask.

The assembly may further comprise a mask seat and a means for rotating the mask seat above and substantially parallel to the mask. In this embodiment, there is at least one recess located in the evaporant-facing side of the mask. The mask seat is positioned above and parallel to the mask. The mask seat also has a channel formed in the mask-facing side and at least one post on the same side. The means for rotating the mask seat above and substantially parallel to the mask are positioned in the channel of the mask seat and the mask is seated on the ball bearing such that the mask and mask seat are parallel to each other and the means are in contact with the evaporant-facing side of the mask. The mask seat and mask are further positioned such that the post of the mask seat is positioned at least partially within the recess of the mask. Rotation of the mask seat causes the post to contact the interior of the recess, such contact causing an impulse to be delivered to the mask, and such impulse causing rotation of the mask.

Alternatively, the assembly may further comprise a mask seat and means for rotating the mask seat above and substantially parallel to the mask. In this embodiment, the mask seat is positioned above and substantially parallel to the mask. The mask seat also has a channel formed in the mask-facing side. The means for rotating the mask seat above and substantially parallel to the mask are positioned in the channel of the mask seat and the mask is in contact with the means such that the mask and mask seat are substantially parallel to each other. The position of the mask seat may be fixed.

In a further embodiment, the inertial masking assembly comprises a mask, and a means for rotating a substrate above and substantially parallel to the mask. The means for rotating a substrate above and substantially parallel to the mask are positioned on the substrate-facing side of the mask. The inertial masking assembly may further comprise a substrate. The substrate is seated on the means for rotating a substrate above and substantially parallel to the mask and positioned such that it is above and parallel to the mask. The means for rotating a substrate above and substantially parallel to the mask separate the mask and substrate such that there is no direct contact between the mask and the substrate. In an embodiment, an abrupt change in the angular velocity of the mask causes the mask to rotate relative to the substrate; whereas a gradual change in the angular velocity of the mask causes both the mask and the substrate to rotate. In another embodiment, an abrupt change in the angular velocity of the substrate causes the substrate to rotate relative to the mask; whereas a gradual change in the angular velocity of the substrate causes both the mask and the substrate to rotate. The means for rotating a substrate above and substantially parallel to the mask may be located along the perimeter of the mask.

The assembly may further comprise a mask seat and a means for rotating the mask above and substantially parallel to the mask seat. In this embodiment, there is at least one recess located in the evaporant-facing side of the mask. The mask seat is positioned below and substantially parallel to the mask. The mask seat has at least one post on the mask-facing side. The means for rotating the mask above and substantially parallel to the mask seat are also positioned on the mask-facing side of the mask seat. The mask is seated on the means such that the mask and mask seat are substantially parallel to each other and the means are in contact with the evaporant-facing side of the mask. The mask seat and mask are further positioned such that the post of the mask seat is positioned at least partially within the recess of the mask. Rotation of the mask seat causes the post to contact the interior of the recess, such contact causing an impulse to be delivered to the mask, and such impulse causing rotation of the mask.

Alternatively, the assembly may further comprise a mask seat and means for rotating the mask above and substantially parallel to the mask seat. In this embodiment, the mask seat is positioned below and parallel to the mask. The means for rotating the mask above and substantially parallel to the mask seat are positioned on the mask-facing side of the mask seat. The mask is seated on the means such that the mask and mask seat are substantially parallel to each other and the means are in contact with the evaporant-facing side of the mask. The position of the mask seat may be fixed.

BRIEF DESCRIPTION OF THE DRAWINGS

For a fuller understanding of the invention, reference should be made to the following detailed description, taken in connection with the accompanying drawings, in which:

FIG. 1A is a perspective view of substrate-facing side of a mask in accordance with an embodiment of the present invention.

FIG. 1B is a perspective view of evaporant-side of a mask in accordance with an embodiment of the present invention.

FIG. 2A is a side-view diagram showing the unassembled component parts of an inertial masking assembly including a substrate, ball bearings, and mask in a deposit-up configuration in accordance with an embodiment of the present invention.

FIG. 2B is a side-view diagram showing an assembled inertial masking assembly including a substrate, ball bearings, and mask in a deposit-up configuration in accordance with an embodiment of the present invention.

FIG. 4A is a side-view diagram showing the unassembled component parts of an inertial masking assembly including a substrate, ball bearings, and mask in a deposit-down configuration in accordance with an embodiment of the present invention.

FIG. 4B is a side-view diagram showing an assembled inertial masking assembly including a substrate, ball bearings, and mask in a deposit-down configuration in accordance with an embodiment of the present invention.

FIG. 5A is a top-view diagram of a mask having a sawtooth-shaped bearing channel and a deposition window.

FIG. 5B is a cross-sectional view of a sawtooth-shaped bearing channel taken along the dashed line in the center of the channel of the mask of FIG. 5A.

FIG. 5C is a cross-sectional view of a sawtooth-shaped bearing channel as shown in FIG. 5B illustrating the ratcheting movement of a ball bearing in the channel and the angle of each elevation along the channel.

FIG. 6A is a side-view diagram showing the unassembled component parts of an inertial masking assembly including a substrate, mask, mask seat, and two sets of ball bearings in accordance with an embodiment of the present invention.

FIG. 6B is a side-view diagram showing an assembled inertial masking assembly including a substrate, mask, mask seat, and two sets of ball bearings in accordance with an embodiment of the present invention.

DETAILED DESCRIPTION OF THE PREFERRED EMBODIMENT

Figures 3A, 3B:
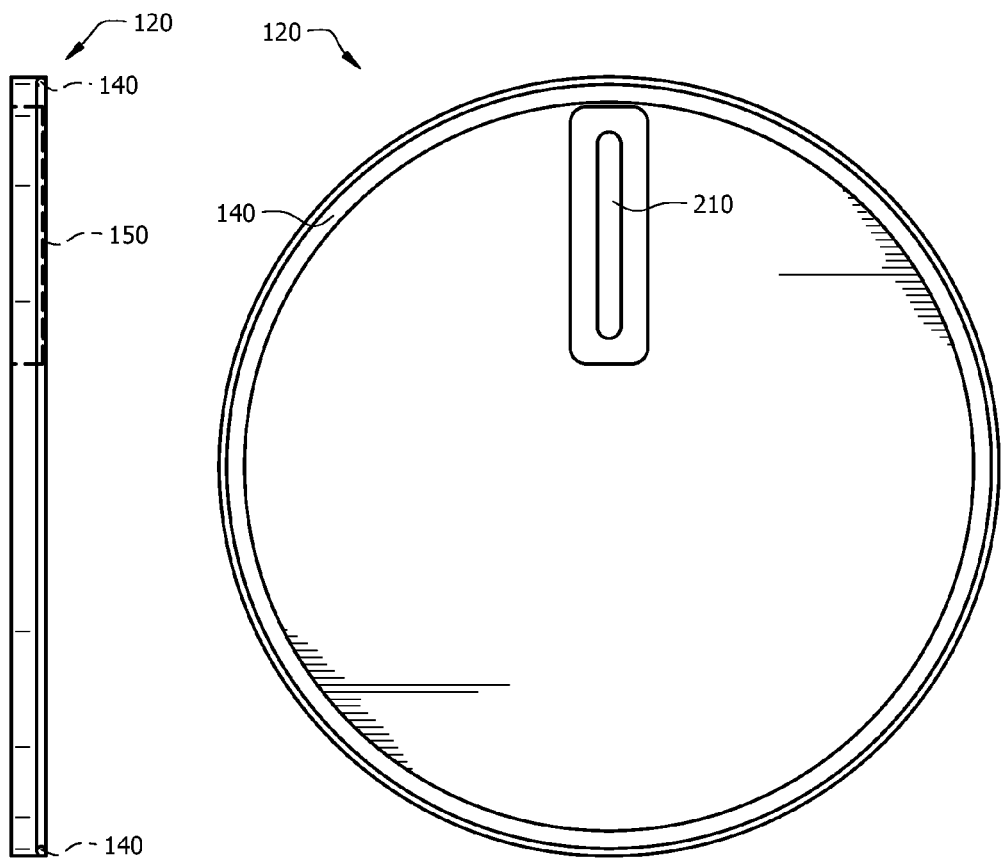
FIG. 3A is a top-view diagram of a mask having a bearing channel and a deposition window.
FIGS. 3B and 3C are side-view diagrams of the mask of FIG. 3A.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention includes an inertial masking assembly that allows multiple thin film structures to be deposited on a single substrate by in situ rotation of a shadow mask relative to the substrate. The assembly rotates the position of the shadow mask by the conservation of momentum. The substrate is seated on ball bearings confined to an orbit within the mask. Abruptly changing the angular velocity of the mask causes the mask to rotate under the substrate, which is mediated by a combination of rolling friction and the substrate's inertia.

As illustrated in the perspective views of FIGS. 1A and 1B, mask 120 includes channel 120 which receives ball bearings (not pictured) and deposition window 150 to allow material to contact the substrate. FIG. 1A shows the substrate-facing side of mask 120 and FIG. 1B shows evaporant-facing side of mask 120. In FIG. 1A, channel 140 is located near the perimeter of mask 120. This shape allows the ball bearing confined within channel 140 to have an orbit concentric with axis of rotation 160.

In an embodiment, as shown in the diagrams of FIGS. 2A and 2B, inertial masking assembly 100 comprises substrate 110, mask 120, and set of ball bearings 130. Substrate 110 is seated on ball bearings 130, located at substrate's 110 perimeter. Ball bearings 130 are confined within channel 140 in mask 120. Mask 120 also contains deposition window 150.

Mask 120 and substrate 110 may be capable of rotation around axis of rotation 160. Further, mask 120 may be fixed to something that can be rotated ex situ, such as a shaft connected to a motor. An impulse or abrupt change in the angular velocity of mask 120 (e.g., via a motor) causes mask 120 to rotate. The inertia of substrate 110 keeps substrate 110 essentially static. This is mediated by the rolling friction associated with ball bearings 130, which effectively decouples substrate 110 from mask 120, allowing them to rotate independently.

Although substrate 110 is rotated and elevated above mask 120 by free-moving ball bearings 130 in the above embodiment, there are other means for rotating substrate 110 above and parallel to substrate 110. For example, ball bearings 130 may be affixed by glue or other affixing means in channel 140. Here, static and kinetic friction replaces rolling friction. Static and kinetic friction are favorable in situations where rolling friction is too low, which can cause substrate 110 to rotate around several times before stopping. Alternatively, substrate 110 may be seated on small fixed objects, or posts, protruding from channel 140 or from the surface of mask 120. In addition, channel 120 may be replaced by a flat-top elevated surface onto which substrate 110 would be seated. The elevated surface may be of any appropriate shape including a ring, like channel 140 shown in FIG. 3A, and a series of arches, like arch-shaped channels 495 shown in FIG. 8. These alternatives also provide for increased static and kinetic friction instead of rolling friction.

As an example, if mask 120 has deposition window 150 as a small hole near its perimeter located at twelve o'clock, the impulse causes the hole to rotate to the one o'clock position. Any final position can be obtained in a piecewise manner via sequential impulses. Assembly 100 can be rotated in synchronization when the angular velocity is changed slowly.

Alternatively, substrate 110 may be removably affixed to something that can be rotated ex situ, such as a shaft connected to a motor. Here, an impulse or abrupt change in the angular velocity of substrate 110 (e.g., via a motor) causes substrate 110 to rotate. The inertia of mask 120 keeps mask 120 essentially static. This is mediated by the rolling friction associated with ball bearings 130, which effectively decouples substrate 110 from mask 120, allowing them to rotate independently.

One of mask 320 and substrate 310 may also be fixed such that there is no rotation around axis of rotation 360 by that particular layer of the assembly.

Substrate 110 may be a flat circular disc (e.g., a silicon wafer) or any other shape, such as a square; however, some sizes and shapes may require the use of a substrate holder. Substrate 110 may be weighted down by a ring or plate placed on top of it suitable for the process.

The material chosen for ball bearings 130 should be appropriate for the process (UHV, High Temperature). In an exemplary embodiment, sapphire is used. However, in another embodiment, which requires that substrate 110 be electrically grounded to the sample holder, SS304 is used. (equally spaced in angle)

Figure 3C:

Diagrams showing three views of mask 200 are shown in FIGS. 3A, 3B, and 3C. FIG. 3A is a top-view of mask 120 having deposition window 150 and channel 140. FIGS. 3B and 3C are side views of mask 120.

The embodiment shown in FIGS. 2A and 2B is utilized for deposit-up tools. The present invention can also be utilized for deposit-down tools. As shown in FIGS. 4A and 4B, inertial masking assembly 300 comprises substrate 310, mask 320, and set of ball bearings 330. Ball bearings 330 are confined within channel 340 in mask 320. Mask 320 also contains deposition window 350. Substrate 310 is positioned below and parallel to mask 320. Substrate 310 is in contact with ball bearings 330 at its perimeter.

Mask 320 and substrate 310 may be capable of rotation around axis of rotation 360. Further, substrate 310 may be removably affixed to something that can be rotated ex situ, such as a shaft connected to a motor. An impulse or abrupt change in the angular velocity of substrate 310 (e.g., via a motor) causes substrate 310 to rotate. The inertia of mask 320 keeps mask 320 essentially static. This is mediated by the rolling friction associated with ball bearings 330, which effectively decouples substrate 310 from mask 320, allowing them to rotate independently.

Alternatively, mask 320 may be fixed to something that can be rotated ex situ, such as a shaft connected to a motor. Here, an impulse or abrupt change in the angular velocity of mask 320 (e.g., via a motor) causes mask 320 to rotate. The inertia of substrate 310 keeps substrate 310 essentially static. This is mediated by the rolling friction associated with ball bearings 330, which effectively decouples substrate 310 from mask 320, allowing them to rotate independently.

One of mask 320 and substrate 310 may also be fixed such that there is no rotation around axis of rotation 360 by that particular layer of the assembly.

In an additional embodiment, illustrated in FIGS. 5A, 5B, and 5C, channel 520 may also be designed to allow a ratcheting mode (i.e., a shape that allows relative motion for only one sense of rotation) and/or a lifting of the substrate from mask 500. The ratcheting mechanism is facilitated by the sawtooth shape of channel 520. The sawtooth shape is shown in FIG. 5B, which is a cross-sectional view of channel 520 along the dotted line shown in FIG. 5A.

The ratcheting mechanism is further illustrated in FIG. 5C, which shows the sawtooth shape of bearing channel 520, the slant angle 527 of the sawtooth shape, a first position 525 and, a second position 526 of the bearing ball, direction 528 of the impulse, and direction 529 of the ball bearing. The delivery of an impulse in direction 528 causes mask 500 to rotate beneath the ball bearing. This causes a ball bearing to move in direction 529 from first position 525 to second position 526. An impulse delivered in the opposite direction will not result in the ball bearing changing positions because of bearing channel's 520 sawtooth shape. The size of slant angle 527 depends on the ball bearing size and the magnitude of the impulse.

Figure 7A:
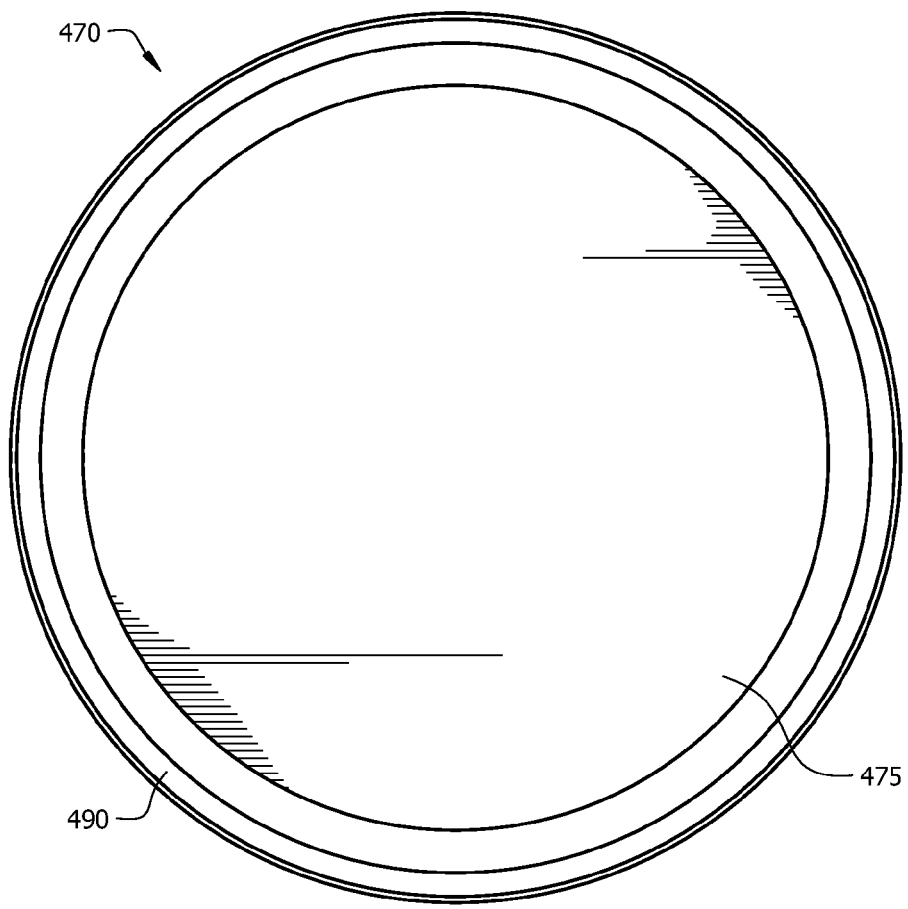
FIG. 7A is a top-view diagram of a mask seat having a bearing channel and a hollow center in accordance with an embodiment of the present invention.
Figure 7B:
FIG. 7B is a side-view diagram of the mask seat of FIG. 7A.

In another embodiment, as illustrated in FIGS. 6A and 6B, inertial masking assembly 400 comprises substrate 410, first set of ball bearings 430, mask 420, second set of ball bearings 480, and mask seat 470. A top-view of mask seat 470 is shown in FIG. 7A. FIG. 7B shows a side view of mask seat 470. Mask seat 470 has channel 490 located at or near its perimeter and is hollow at its center 475.

As shown in FIGS. 6A and 6B, mask 420 is seated on ball bearings 480, which are confined within channel 490. Mask 420 has deposition window 450 and channel 440. Substrate 410 is seated on ball bearings 430, which are confined within channel 440.

Substrate 410, mask 420, and mask seat 470 may each be free to rotate about center of rotation 460 or one or more of the layers may be fixed. In addition, one or more of substrate 410, mask 420, and mask seat 470 may be held rigidly to a rotating shaft (not shown) or other rotating means as known in the art. In one embodiment, substrate 410 and mask seat 470 are fixed and mask 420 is free to rotate. Rotation is facilitated by ball bearing 430 and ball bearings 480. This embodiment allows a sample positioned on substrate 410 to be connected electrically.

Figure 8:
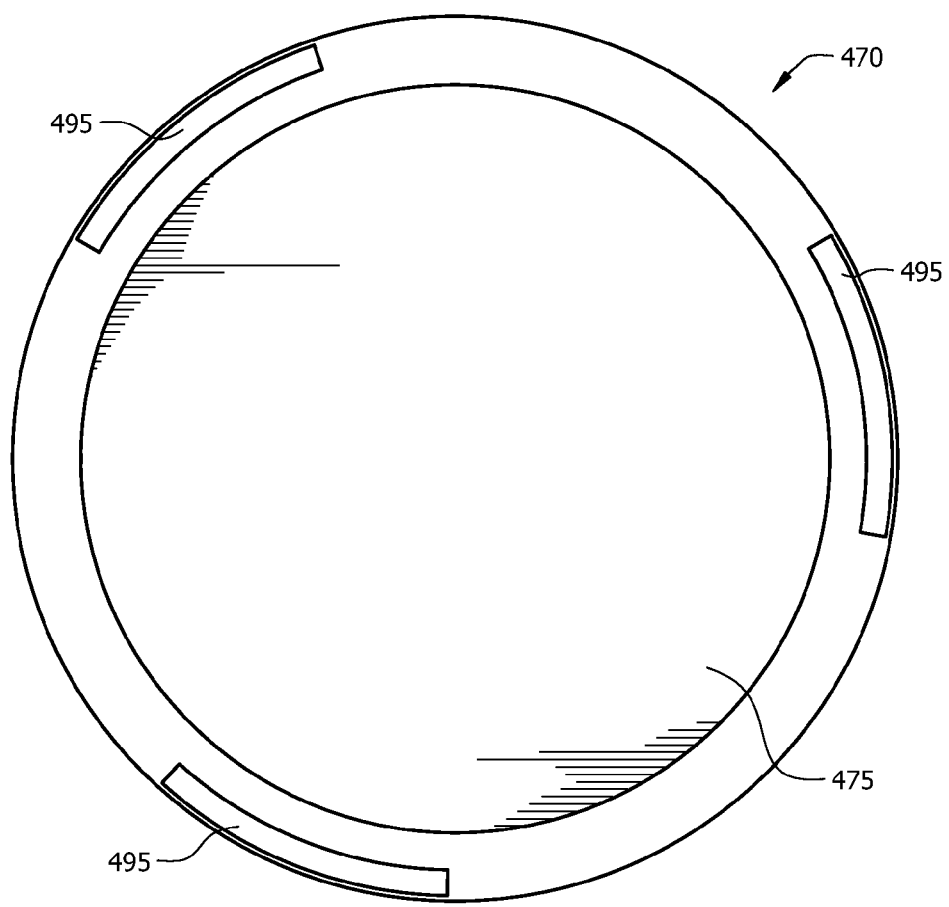
FIG. 8 is a top-view diagram of a mask seat having multiple arch-shaped bearing channels and a hollow center in accordance with an embodiment of the present invention.

In another embodiment, ball bearings 480 have a confined length of travel. This may be achieved by placing one or more barriers in channel 490 or replacing channel 490 with a series of arch-shaped channels 495, as shown in FIG. 8. Confining the length of travel of the ball bearing 480 induces an impulse. This impulse would rotate mask 440 relative to substrate 410.

Figure 9A:
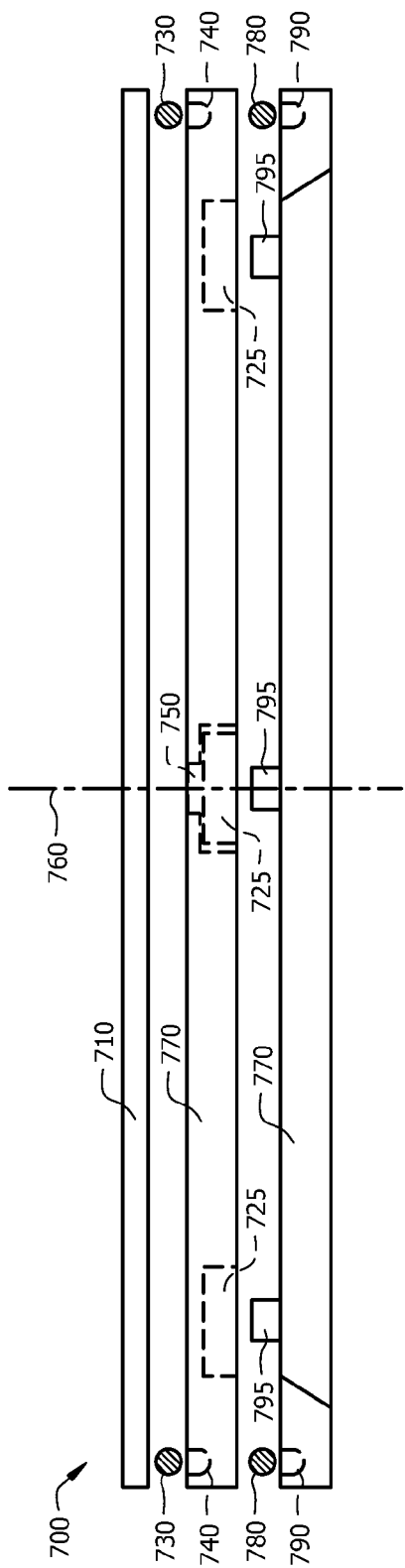
FIG. 9A is a side-view diagram showing the unassembled component parts of an inertial masking assembly including a substrate, a mask having multiple recesses, a mask seat having multiple posts, and two sets of ball bearings in accordance with an embodiment of the present invention.
Figure 9B:
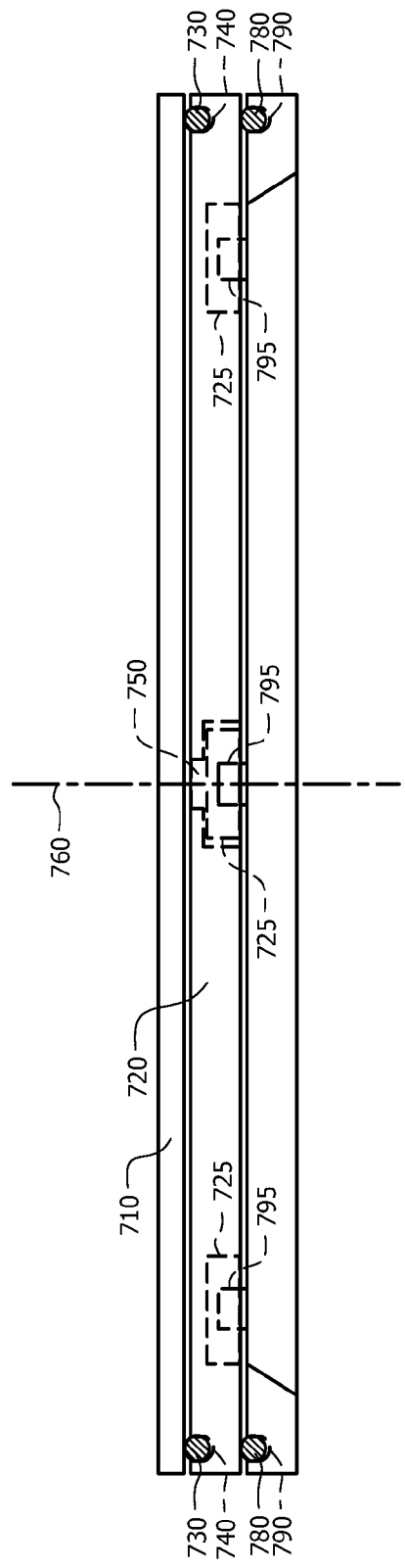
FIG. 9B is a side-view diagram showing an assembled inertial masking assembly including a substrate, a mask having multiple recesses, a mask seat having multiple posts, and two sets of ball bearings in accordance with an embodiment of the present invention.

In an additional embodiment, as shown in FIGS. 9A and 9B, an impulse is created by pillars 795 protruding from mask seat 770 and into recesses 725 formed in mask 720. Mask 720 sits on ball bearings 780 located in channel 790 of mask seat 770, with pillars 795 of mask seat 770 inserted into corresponding recesses 725 in the bottom of mask 720. Mask seat 770 may be held rigidly to a rotating shaft (not shown) or other rotating means known in the art. When mask seat 770 rotates, mask 720 initially remains stationary (mediated by rolling friction of ball bearings 780) until pillars 795 make contact with the interior of recesses 725. Contact between pillars 795 and the interior of recesses 725 delivers an impulse to mask 720. This impulse is sufficient to result in a significant relative rotation of mask 720 with respect to substrate 710.

Figure 10A:
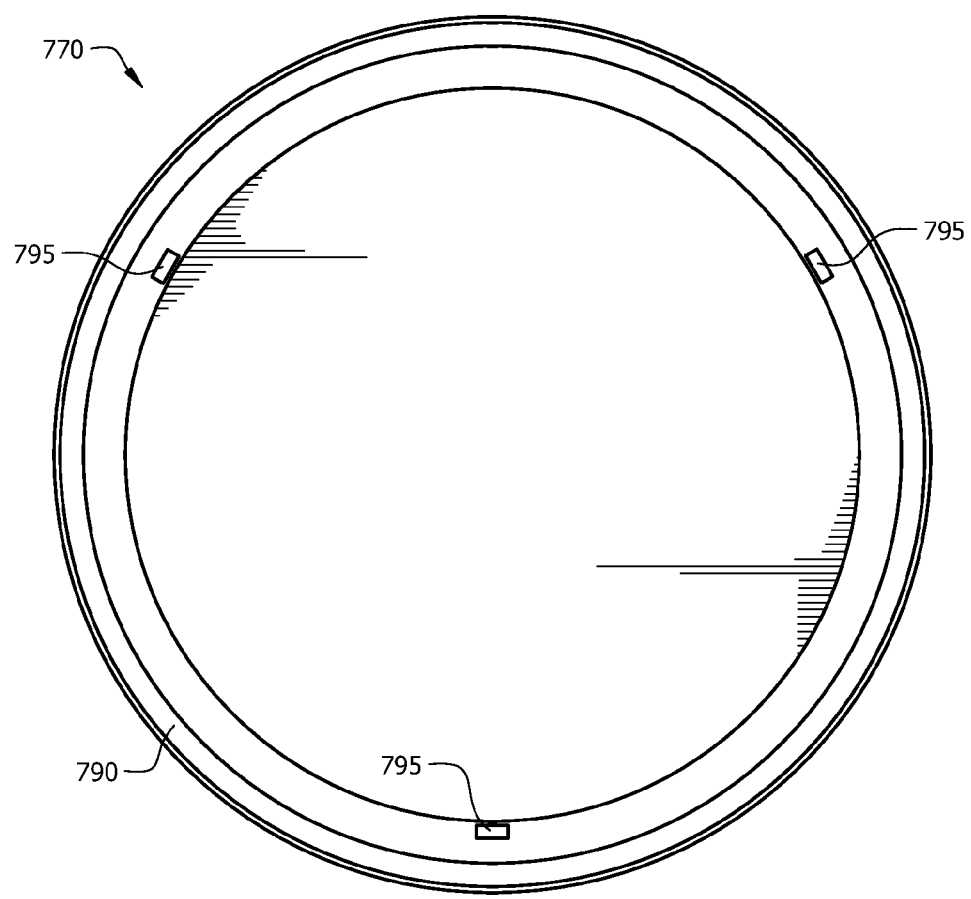
FIG. 10A is a top-view diagram of a mask seat having a bearing channel, multiple posts, and a hollow center in accordance with an embodiment of the present invention.
Figure 10B:
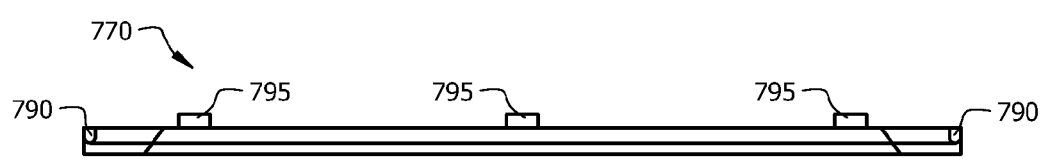
FIG. 10B is a side-view diagram of the mask seat of FIG. 10A.
Figure 11A:
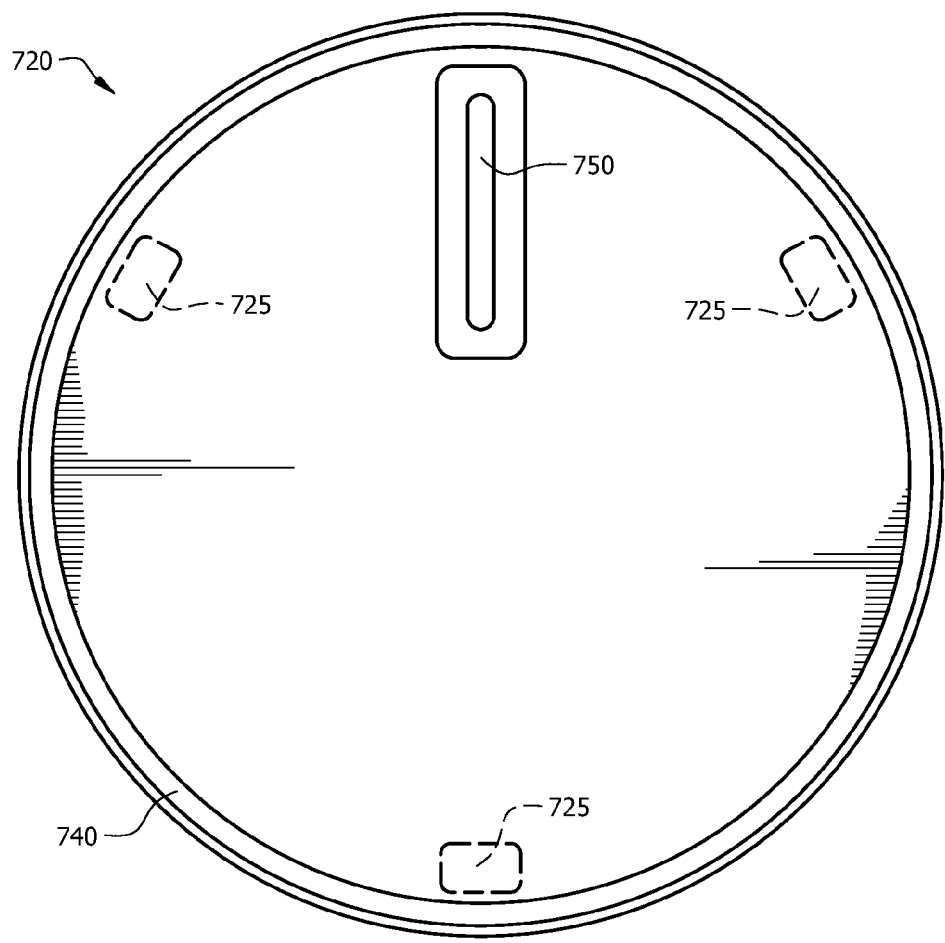
FIG. 11A is a top-view diagram of a mask having a bearing channel, multiple recesses, and a deposition window.
Figure 11B:
FIG. 11B is a side-view diagram of the mask seat of FIG. 11A.

Example locations and relative sizes of pillars 795 are illustrated in FIGS. 10A (top view) and 10B (side view). FIGS. 11A (top view) and 11B (side view) show corresponding recesses 725 in mask 720. The location of recesses 725 are shown in FIG. 11A as dotted lines as they are located on bottom, or evaporant-facing side, of mask 720 and FIG. 11A is a top view.

Figure 12:
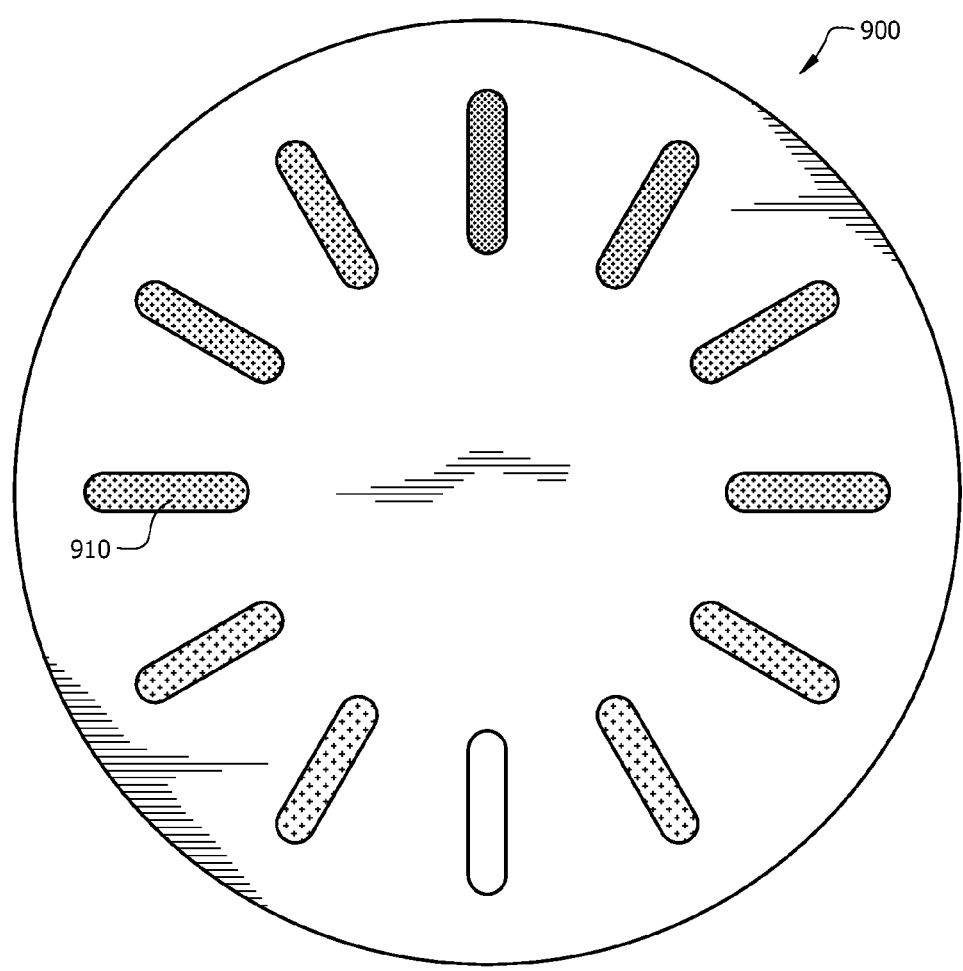
FIG. 12 is a top-view diagram of a substrate with multiple thin film structure deposited thereon.

FIG. 12 shows an example of substrate 900 with sequential film deposits 910 with different physical characteristics (indicated by different shades of gray here) as produced by the present invention.

The present invention provides for lowered monetary expenses by utilizing a single substrate for multiple samples and increased efficiency/productivity by obviating the time and contamination incurred by inserting/removing individual substrates for the same number of samples. The deposition system also provides a simplified method for depositing multiple samples on one substrate while otherwise retaining all functionality of the tool (e.g., simultaneous rotation, heating, and rf biasing). Present techniques that allow the same end goal involve multiple motors, excessive computer control, and limit the general functionality of the tool (e.g., limited to room temperature operation).

The present invention may be used with any vacuum-based physical deposition tool such as sputtering, electron-beam evaporation, molecular beam epitaxy, pulsed laser deposition, laser ablation, and pulsed electron deposition. It is also applicable for non-vacuum-based deposition tools such as electrodeposition.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. An apparatus for thin film deposition, the apparatus comprising:
    a mask having a substrate-facing side;
    a channel formed in the mask on the substrate-facing side; and
    a means for rotating a substrate above and substantially parallel to the mask, the means positioned in the channel of the mask.

2. The apparatus of claim 1, further comprising:
    a substrate seated on the means for rotating a substrate above and substantially parallel to the mask such that the mask and the substrate are not in direct contact.

3. The apparatus of claim 1, wherein the channel formed in the mask is located along the perimeter of the mask.

4. The apparatus of claim 1, wherein the cross-section of the channel formed in the mask has a saw-tooth shape.

5. The apparatus of claim 1, further comprising
    an evaporant-facing side of the mask;
    at least a first recess located in the evaporant-facing side of the mask;
    a mask seat positioned below and substantially parallel to the mask and having a mask-facing side;
    at least a first post positioned on the mask-facing side of the mask seat;
    a channel formed in the mask-facing side of the mask seat;
    an additional means for rotating the mask above and substantially parallel to the mask seat, the means positioned in the channel of the mask seat and in contact with the evaporant-facing side of the mask; and
    wherein the mask seat and the mask are arranged such that the at least first post of the mask seat is positioned at least partially within the at least first recess of the mask.

6. The apparatus of claim 1, further comprising:
    an evaporant-facing side of the mask;
    a mask seat positioned below and substantially parallel to the mask and having a mask-facing side;
    a channel formed in the mask-facing side of the mask seat; and
    an additional means for rotating the mask above and substantially parallel to the mask seat, the means positioned in the channel of the mask seat and in contact with the evaporant-facing side of the mask.

7. The apparatus of claim 6, wherein the position of the mask seat is fixed.

8. An apparatus for thin film deposition, the apparatus comprising:
    a mask having a substrate-facing side;

a channel formed in the mask on the substrate-facing side; and a means for rotating the mask above and substantially parallel to a substrate, the means positioned in the channel of the mask.

9. The apparatus of claim 8, further comprising:

a substrate in contact with the means for rotating the mask above and substantially parallel to a substrate and positioned below and substantially parallel to the mask such that the mask and the substrate are not in direct contact.

10. The apparatus of claim 8, wherein the channel formed in the mask is located along the perimeter of the mask.

11. The apparatus of claim 8, further comprising:

an evaporant-facing side of the mask;

at least a first recess located in the evaporant-facing side of the mask;

a mask seat positioned above and substantially parallel to the mask and having a mask-facing side;

at least a first post positioned on the mask-facing side of the mask seat;

a channel formed in the mask-facing side of the mask seat;

an additional means for rotating the mask seat above and substantially parallel to the mask, the means positioned in the channel of the mask seat and in contact with the evaporant-facing side of the mask; and wherein the mask seat and the mask are arranged such that the at least first post of the mask seat is positioned at least partially within the at least first recess of the mask.

12. The apparatus of claim 8, further comprising:

an evaporant-facing side of the mask;

a mask seat positioned above and substantially parallel to the mask and having a mask-facing side;

a channel formed in the mask-facing side of the mask seat; and an additional means for rotating the mask seat above and substantially parallel to the mask, the means positioned in the channel of the mask seat and in contact with the evaporant-facing side of the mask.

13. The apparatus of claim 12, wherein the position of the mask seat is fixed.

14. An apparatus for thin film deposition, the apparatus comprising:

a mask having a substrate-facing side; and a means for rotating a substrate above and substantially parallel to the mask, the means positioned on the substrate-facing side of the mask.

15. The apparatus of claim 14, further comprising:

a substrate seated on the means for rotating a substrate above and substantially parallel to the mask such that the mask and the substrate are not in direct contact.

16. The apparatus of claim 14, wherein the means for rotating a substrate above and substantially parallel to the mask is located along the perimeter of the mask.

17. The apparatus of claim 14, further comprising an evaporant-facing side of the mask;

at least a first recess located in the evaporant-facing side of the mask;

a mask seat positioned below and substantially parallel to the mask and having a mask-facing side;

at least a first post positioned on the mask-facing side of the mask seat;

an additional means for rotating the mask above and substantially parallel to the mask seat, the means positioned on the mask-facing side of the mask seat and in contact with the evaporant-facing side of the mask; and wherein the mask seat and the mask are arranged such that the at least first post of the mask seat is positioned at least partially within the at least first recess of the mask.

18. The apparatus of claim 14, further comprising:

an evaporant-facing side of the mask;

a mask seat positioned below and substantially parallel to the mask and having a mask-facing side; and an additional means for rotating the mask above and substantially parallel to the mask seat, the means positioned on the mask-facing side of the mask seat and in contact with the evaporant-facing side of the mask.

19. The apparatus of claim 18, wherein the position of the mask seat is fixed.

\* \* \* \* \*